(12) United States Patent
Beppu

(10) Patent No.: US 6,370,628 B2
(45) Date of Patent: *Apr. 9, 2002

(54) NONVOLATILE SEMICONDUCTOR DISK DEVICE LIMITING A NUMBER OF SIMULTANEOUS TRANSFERS AND ASSOCIATED CONTROL PROCESS

(75) Inventor: Atsushi Beppu, Minato-ku (JP)

(73) Assignee: Oki Electric Industry Co., Ltd., Tokyo (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 90 days.

(21) Appl. No.: 08/929,423

(22) Filed: Sep. 15, 1997

(30) Foreign Application Priority Data

May 16, 1997 (JP) ............................................. 9-126150

(51) Int. Cl.[7] ........................... G06F 12/00; G06F 13/00
(52) U.S. Cl. ....................... 711/163; 711/103; 711/154; 365/230.01; 365/233
(58) Field of Search ................................. 711/103, 109, 711/147, 154, 163; 365/185.33, 185.11, 52, 200, 230.03, 189.05

(56) References Cited

U.S. PATENT DOCUMENTS

| | | | | |
|---|---|---|---|---|
| 5,293,236 A | * | 3/1994 | Adachi et al. | 348/231 |
| 5,513,138 A | * | 4/1996 | Manabe et al. | 365/185.33 |
| 5,517,241 A | | 5/1996 | Adachi et al. | 348/231 |
| 5,526,506 A | * | 6/1996 | Hyatt | 711/111 |
| 5,603,001 A | * | 2/1997 | Sukegawa et al. | 711/103 |

FOREIGN PATENT DOCUMENTS

EP          0 528 280 A1      8/1992

* cited by examiner

Primary Examiner—Tuan V. Thai
(74) Attorney, Agent, or Firm—Volentine Francos, PLLC

(57) ABSTRACT

Write data, when given from a host via an interface, are temporarily stored in a buffer memory of a disk control unit. A number-of-chips managing unit manages the number of memory chips executing writing operations. If the number of memory chips in the process of writing operations does not reach a fixed number, the write data are transferred to the memory chips allocated to, corresponding write areas. Whereas if the number of memory chips in the process of writing operations reaches the fixed number, the write data are transferred after an end of the writing operations to the memory chips in the process of writing operations. An entire electric current during the writing operation of a disk card can be thereby restricted.

6 Claims, 3 Drawing Sheets

NONVOLATILE SEMICONDUCTOR DISK DEVICE LIMITING A NUMBER OF SIMULTANEOUS TRANSFERS AND ASSOCIATED CONTROL PROCESS

BACKGROUND OF THE INVENTION

The present invention relates to a nonvolatile semiconductor disk device (hereinafter referred to as a "disk card") as one of peripheral function extender cards of a personal computer (hereinafter abbreviated to a "PC"), etc., and also relates to writing control to this disk card.

The disk card as a peripheral device of the PC is stored with data.

Then, the disk card is capable of holding a content of the storage without requiring a power supply.

Next, a nonvolatile semiconductor memory such as, e.g., a flash memory is employed as a storage medium of the disk card.

This nonvolatile semiconductor memory is stored with the data in such a form as to be formatted to a fixed size called a sector as in the case of the disk device like a flexible disk and a hard disk.

Incidentally, the disk card in a name card size becomes, with increases by leaps in storage capacity of the semiconductor memory, capable of storing the data of several tens of Mega bytes.

This disk card is used for storing data about a picture photographed by, e.g., a digital camera in the way of utilizing merits of being small in size but large in capacity and of the storage content being held even when switching off the power supply.

Next, the disk card with a completion of the photography is taken out of the digital camera and set in the PC, and the image data stored thereon can be read and digitally processed.

FIG. 1 is a diagram showing one example of a conventional disk card.

This disk card includes an interface unit 10 connected to a host 1 such as the digital camera and the PC, a central processing unit (hereinafter abbreviated to a "CPU") 20 for executing whole control within the disk card by transmitting and receiving a variety of control signals to and from this host 1, a disk control unit 30 for controlling a transfer of the data to the host 1, an internal bus 40 through which to transfer the data inwardly the disk card, and a storage unit 50 for storing the data.

Then, the disk control unit 30 has a buffer memory 31 for temporarily holding sector-basis data given from the host 1.

The sector contains e.g., 536-bytes data in such a fixed format that a header portion containing data about a validity, etc. of this sector and a correction code for correcting an error are added to, e.g., 512-bytes data.

The disk control unit 30 incorporates a function to write sector-basis data to the corresponding storage unit 50 via the internal bus 40 on the basis of an address signal given via the interface unit 10, and to read the sector-basis data stored in the storage unit 50.

The storage unit 50 is constructed of a plurality (e.g., 15 pieces) of memory chips 50a, 50b, . . . , 50n connected in common to the internal bus 40.

Addresses different from each other are allocated to these memory chips 50a–50n.

Then, each of the memory chips 50a–50n has the same construction, and includes a buffer memory 51 for temporarily holding the sector-basis data and a nonvolatile semiconductor memory 52 for storing the sector-basis data.

The nonvolatile semiconductor memory 52 is capable of holding a content of the storage even if a supply of the power supply is stopped.

Each of the memory chips 50a–50n has a memory control unit 53 for controlling a transfer of the sector-basis data between the buffer memory 51 and the nonvolatile semiconductor memory 52.

Next, in this disk card, when the host 1 issues a command to write the data, the write data is temporarily held in the buffer memory 31 within the disk control unit 30 via the interface unit 10.

The data held in the buffer memory 31 is transferred to and held in the buffer memory 51 in one of the memory chips 50i (however, i=a to n) which corresponds to the address thereof via the internal bus 40.

The data held in the buffer memory 51 in the memory chip 50i is written to a predetermined storage area in the nonvolatile semiconductor memory 52 under the control of the memory control unit 53.

At this time, a transfer time of the data transferred from the host 1 to the buffer memory via the interface unit 10 and the buffer memory 31, is on the order of several hundred $\mu$s.

On the other hand, for instance, a time of several ms is required for writing the data temporarily held in the buffer memory 51 to the semiconductor memory 52.

For this purpose, the storage unit 50 is divided into a plurality of memory chips 50a–50n, and each memory chip, e.g., 50a is provided with the buffer memory 51 and the nonvolatile semiconductor memory 52.

Then, the data is independently written to the nonvolatile semiconductor memory 52 from each of the buffer memories 51. With this operation, there can be substantially equivalently executed the writing process to the disk card from the host 1.

On the other hand, under the control of the CPU 20, when the host 1 issues a command to read the data, a reading command is given to the memory chip 50a stored with the data to be read.

Then, the sector-basis data is read from the corresponding storage area in the nonvolatile semiconductor memory 52.

The thus read data is temporarily held in the buffer memory 51 and thereafter held in the buffer memory 31 within the disk control unit 30 via the internal bus 40.

The data written to the buffer memory 31 is further transferred to the host 1 via the interface unit 10.

There arise, however, the following problems inherent in the prior art disk card.

In the disk card, the storage unit 50 is divided into the plurality of memory chips 50a–50n in order to substantially equivalently hold an access speed for high-velocity writing and reading processes in the interface unit 10.

Next, each of the memory chips 50a–50n is provided with the buffer memory 51.

Then, the disk card is capable of equivalently executing the writing operations at the high speed by executing the writing operations to the memory chips 50a–50n in parallel.

An electric current necessary for the writing operation per memory chip is on the order of, e.g., 15 mA.

A total operation current, when the number of the memory chips 50a–50n in the process of the simultaneous writing operations increases, becomes large.

Accordingly, only the storage unit 50 requires a current of approximately 150 mA when ten pieces of memory chips 50i are in the simultaneous writing operations.

Therefore, the host 1 must include a power supply having a current capacity allowing for it.

The thus constructed disk card is used not only simply as a peripheral device of the PC but also for storing data about photographed picture in such a way as to be attached to, e.g., a digital camera.

The digital camera is driven by a battery and therefore has a limit in terms of being supplied with a large current when writing the image data.

It is a primary object of the present invention, which was contrived to obviate the problems inherent in the prior art described above, to provide a disk card requiring no large current of a power supply by restricting the number of memory chips 50a–50n in the process of simultaneous writing operations.

SUMMARY OF THE INVENTION

To accomplish the above object, a nonvolatile semiconductor disk device according to the present invention is a disk card comprising an interface unit for transferring data given from outside, a plurality of memory chips each including a nonvolatile semiconductor memory for storing data and a buffer memory for temporarily holding the data to write the data to the semiconductor memory, and a control unit for outputting the data transferred via the interface unit, reading the data from a corresponding memory chip in accordance with a designation given from outside and outputting the data to the interface unit. The control unit monitors the number of simultaneous writing processes that are simultaneously being executed in the plurality of memory chips, and controls the outputs of the data given from outside to the corresponding memory chips so that the number of simultaneous writing processes does not exceed a predetermined number.

Next, in the nonvolatile semiconductor disk device, the control unit has a function added thereto, to output the data to the memory chips and thereafter to start monitoring a completion of the writing processes to the memory chips after an elapse of a fixed time substantially corresponding to a necessary writing time in the memory chips.

Then, the nonvolatile semiconductor disk device is so constructed as to take a card-like configuration as a disk card and to be attachable and detachable to the processor through the interface unit.

The nonvolatile semiconductor disk device, since the disk card is constructed as described above, exhibits the following operations.

The control unit, when the data is transferred from the processor via the interface unit, checks the number of memory chips that are now in the process of the writing operations.

Then, the control unit outputs the data to the relevant memory chips if the number of the memory chips in the writing processes is less than a predetermined number.

The control unit, if the number of the memory chips in the writing processes is the predetermined number, does not output the data to the relevant memory chips till the number of the simultaneous writing processes becomes less than the predetermined number.

Then, the control unit outputs the data to the memory chips just when the number of the simultaneous writing processes becomes less than the predetermined number.

Next, the nonvolatile semiconductor disk device exhibits the following operations.

The control unit checks the number of the memory chips that are now in the writing processes when the data is transferred from the processor via the interface unit.

Then, the control unit, if the number of the memory chips in the writing processes is less than the predetermined number, outputs the data to the relevant memory chips.

Subsequently, the control units, after an elapse of a fixed time substantially corresponding to a necessary write time, starts monitoring whether or not the writing processes are completed.

On the other hand, the control unit, if the number of the memory chips in the writing processes, does not output the data to the relevant memory chips till the number of the simultaneous operations becomes less than the predetermined number.

Then, the control unit, if the number of the simultaneous writing operations is less than the predetermined number as a result of monitoring the completion of the writing processes, outputs the data to the memory chips, and the data is written to the semiconductor memory in the memory chip.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

First Embodiment

Figure 1:
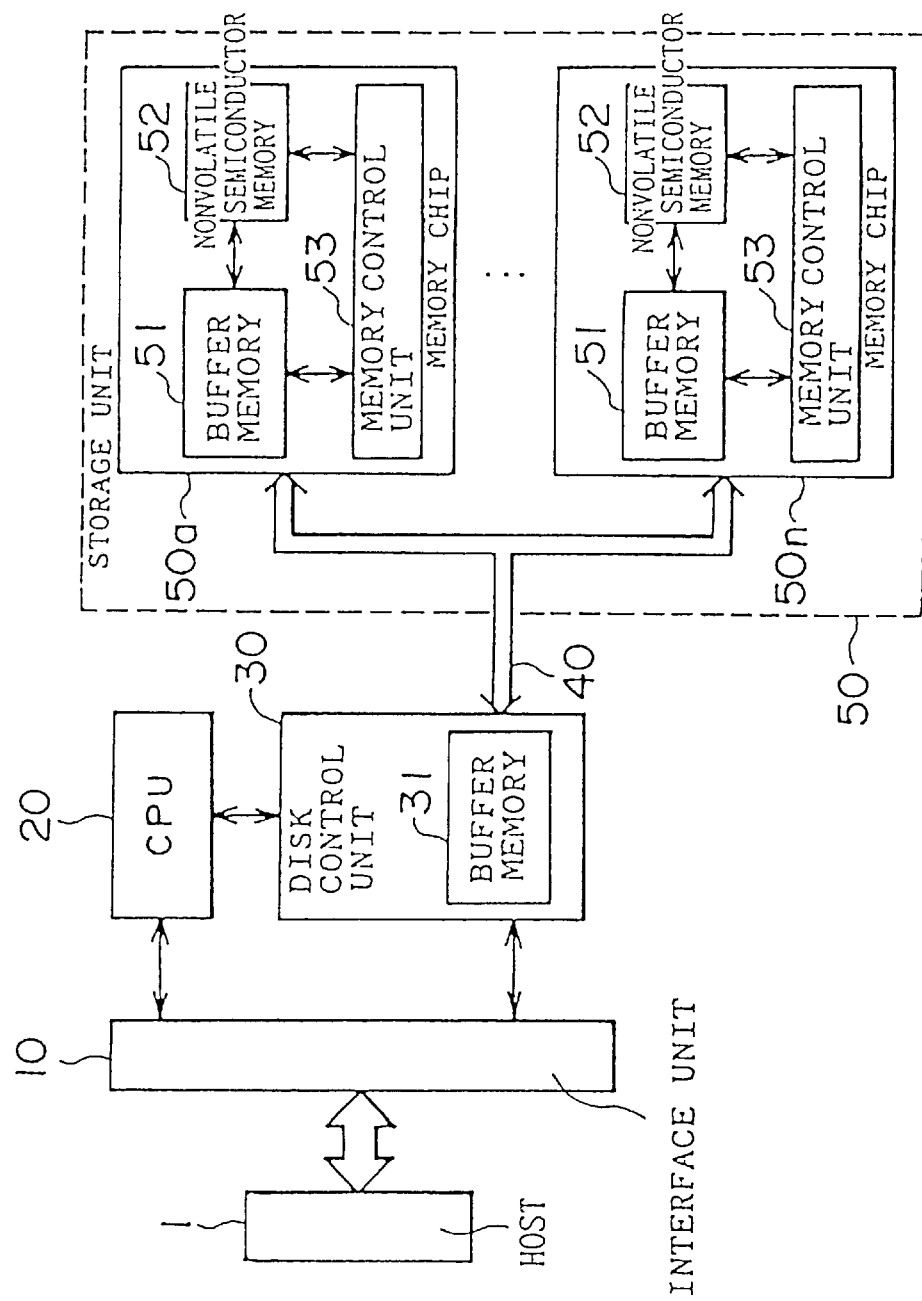
FIG. 1 is a diagram showing a construction of a conventional disk card.
Figure 2:
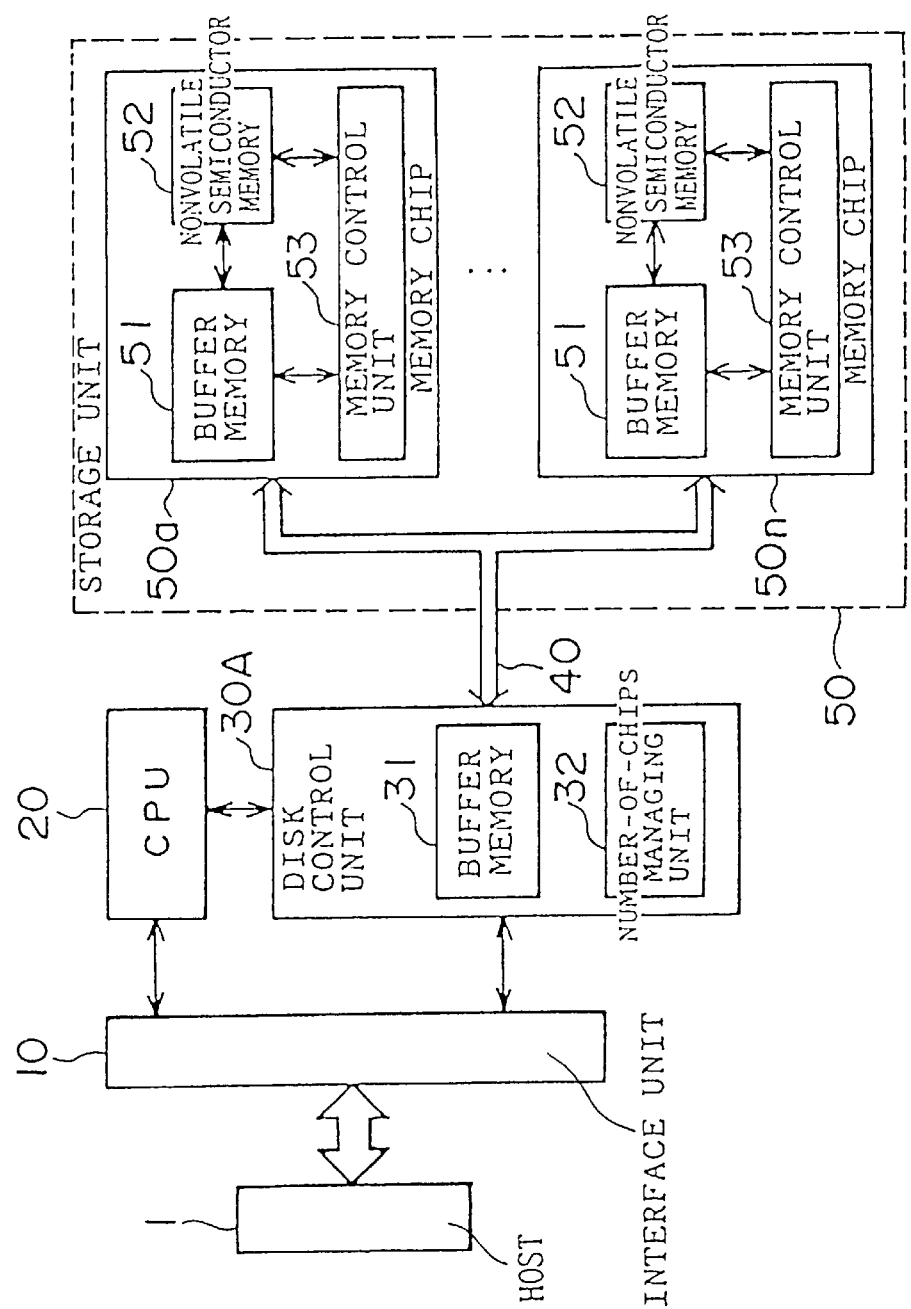
FIG. 2 is a diagram illustrating a construction of a disk card in a first embodiment of the present invention.

FIG. 2 is a diagram showing a construction of a disk card in a first embodiment of the present invention.

Referring to FIG. 2, the elements common to those of the prior art disk card shown in FIG. 2 are marked with the common numerals.

This disk card takes a card-like configuration in a name card size enough to be attachable to a digital camera, etc.

The disk card includes an interface module (e.g., an interface unit) 10, control modules (e.g., a CPU 20 and a disk control unit 30A), an internal bus and a storage unit 50.

The interface unit 10 is, as in the case of the prior art disk card, connected to a host 1 such as a digital camera and a PC.

Then, the interface unit 10 pursuant to, for example, the ATA (Advanced Technology Attachment) Standards defined as hard disk standards proposed by IBM in U.S.A., is connected to the host 1 and transmits and receives data and a variety of control signals.

A CPU 20 for controlling the whole units within the disk card and a disk control unit 30A incorporating functions different from those in the prior art, are connected to the interface unit 10 in the same way with the prior art.

This disk control unit 30A includes a buffer memory 31, having storage capacity for a plurality of sectors, for temporarily storing sector-basis data (e.g., 536 bytes) given from the host 1.

Therefore, as far as empty sectors exist in the buffer memory 31, the disk control unit 30A is capable of inputting the sector-basis data from the host irrespective of an operating status of the storage unit 50.

The disk control unit 30A monitors the number of simultaneous operations of memory chips 50a–50n in the storage unit 50 in addition to the conventional functions described above.

Then, the disk control unit 30A has a number-of-chips managing unit 32 for controlling so as not to simultaneously execute writing operations to more than a predetermined number of memory chips 50$i$ (however, i=a–n).

The number-of-chips managing unit 32 has, e.g., three pieces of unillustrated registers 32$a$ for registering addresses of the memory chips 50$i$ that are in the process of writing operations.

The internal bus 40 is a common bus for transferring the data between the disk control unit 30A and the storage unit 50.

Then, the internal bus 40 is constructed of an address line, a data line and a control line.

The storage unit 50 consists of a plurality (e.g., 15 pieces) of memory chips 50$a$–50$n$ connected in common via the internal bus in the same way with the prior art.

These memory chips 50$a$–50$n$, to which addresses different from each other are allocated, each take the same configuration, and respectively have a buffer memory 51 for temporarily storing the sector-basis data and a nonvolatile semiconductor memory 52 for storing the sector-basis data.

Each nonvolatile semiconductor memory 52 has a storage capacity of, e.g., an 8M bits, and contents of the storage are held even if a supply of the power supply is stopped.

Then, each of the memory chips 50$a$–50$n$ has a memory control unit 53 for controlling a transfer of the sector-basis data between the buffer memory 51 and the nonvolatile semiconductor memory 52.

Next, operations of the thus constructed disk card will be explained.

Write data is, when the host 1 issues a command to write the data, temporarily written to the buffer memory 31 in the disk control unit 30A via the interface unit 10.

The three registers 32$a$ within the number-of-chips managing unit 32 are registered with the addresses of the memory chips 50$i$ in the process of the writing operations.

Then, the number-of-chips managing unit 32 checks contents of these three registers 32$a$ when the data writing command is given thereto.

If there exists an empty-status register 32$a$ registered with no address, the address of the memory chip 50$i$ to which the data is to be written is registered in this empty-status register 32$a$.

Subsequently, the write data is outputted to that memory chip 50$i$.

Thus, the data writing operation is started in the memory chip 50$i$.

After outputting the write data, the disk control unit 30A periodically monitors statuses of the memory chips 50$i$ in the process of the writing operations, the addresses of which are registered in the three registers 32$a$, thereby monitoring a completion of the writing operation.

In monitoring the status, for instance, a reading command is issued to the memory chip 50$i$, and, if a response therefrom is a BUSY status, it is judged that the writing operation is uncompleted.

On the other hand, if the three registers 32$a$ are all in use just when the host 1 issues the data writing command, and even when executing no writing operation to the data writing target memory chip 50$i$, the output of the write data to the memory chip 50$i$ from the disk control unit 30A remains stopped till a completion of the writing operations to the memory chips 50$i$ the addresses of which are registered in the three registers 32$a$.

Then, when the completion of the writing operations to the one memory chips is detected by a status monitoring process, the addresses of the memory chips 50$i$ are registered to the empty registers 32$a$, and the writing command is given to the memory chips 50$i$.

Thus, the disk control unit 30A in the disk card in accordance with the first embodiment incorporates the number-of-chips managing unit 32 for monitoring the number of the memory chips 50$a$–50$n$ which operate simultaneously, whereby it never happens that the memory chips 50$i$ exceeding the number of chips that is preset by the number-of-chips managing unit 32 simultaneously perform the writing operations.

Accordingly, a consumption electric current of the storage unit 50 that is needed when writing the data to the memory chips 50$i$ comes to a maximum value corresponding to the number of chips which is set by the number-of-chips managing unit 32.

Hence, there might be such an advantage that the power supply having a large capacity is not required to be prepared for the processor 1 such as, e.g., a digital camera, etc.

Further, the disk control unit 30A includes the buffer memory 31 capable of temporarily holding plural pieces of data given from the host 1, and therefore, even when the writing operations to the memory chips 50$i$ are limited, it is feasible to receive the data from the host 1. An influence on the processing on the side of the host 1 is thus reduced.

Second Embodiment

Figure 3:
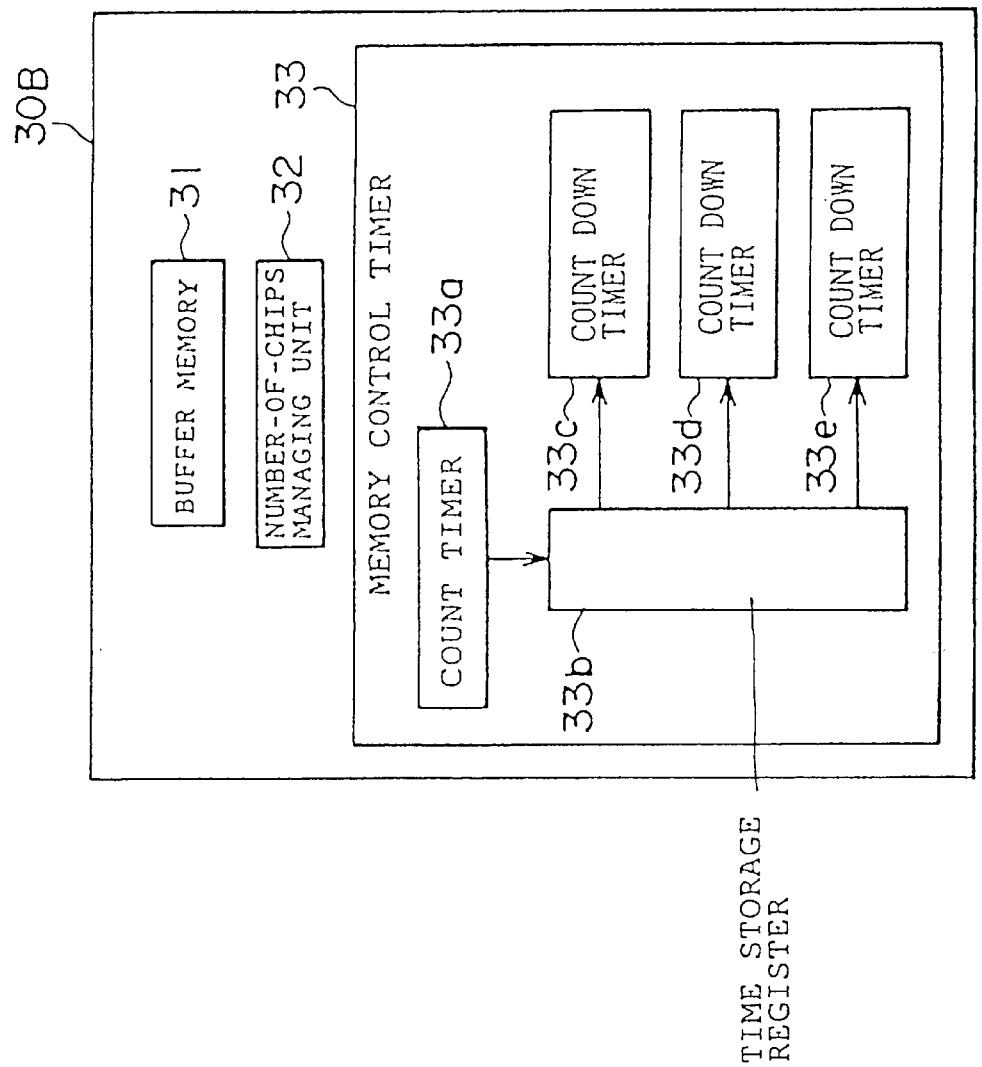
FIG. 3 is a diagram illustrating a configuration of a disk control unit in the disk card in a second embodiment of the present invention.

FIG. 3 is a diagram showing a construction of the disk control unit in the disk card in a second embodiment of the present invention.

Referring to FIG. 3, the components common to those in FIG. 2 are marked with the common numerals.

A disk control unit 30B is substitute for the disk control unit 30A in FIG. 2.

Then, the disk control unit 30B is constructed by adding a memory control timer 33 to the disk control unit 30A.

The memory control timer 33 has a count timer 33$a$ for counting a necessary write time in the memory chip 50$i$.

The count timer 33$a$ is a timer, when the disk card executes the writing operation for the first time, for counting the time needed for this writing operation.

An output side of the count timer 33$a$ is connected to a time storage register 33$b$ for storing the time counted by the count timer 33$a$ as a time substantially corresponding to the necessary write time.

Then, three pieces of count-down timers 33$c$, 33$d$, 33$e$ are connected to an output side of the time storage register 33$b$, corresponding to the three registers 32$a$ used for the number-of-chips managing unit 32 managing the number of chips performing the simultaneous writing operations.

The count-down timers 33$c$–33$e$ count down the necessary write time loaded from the time storage register 33$b$ with an elapse of time.

Then, the count-down timers 33$c$–33$e$, when values thereof come to "0", start monitoring the completion of the writing operations to the relevant memory chips 50$i$.

In the thus constructed disk card, when the host 1 issues the data writing command, the write data is temporarily written to the buffer memory 31 in the disk control unit 30B via the interface unit 10.

Just when o one of the three registers 32$a$ in the number-of-chips managing unit 32 is emptied, the address of the writing target memory chip 50$i$ is registered in this empty register 32, and the write data is transferred to this memory chip 50$i$.

Furthermore, a content of the time storage register 33$b$ is loaded into a count-down timer 33$j$ (however, j=c–e) corresponding to that register 32$a$.

With this process, the operation of writing the data starts within the memory chip 50i, and simultaneously the count-down timer 33j starts counting down.

When a value of the count-down timer 33j comes to "0", the disk control unit 30B is informed of this purport, and the disk control unit 30B monitors a status of the relevant memory chip 50i.

Thus, in the disk card in accordance with the second embodiment, the disk control unit 30 incorporates the memory control timer 33, and just when the writing process is completed, this memory control timer 33 gives a notification.

Accordingly, there is no necessity for monitoring the completion of the writing process to the memory chip 50i within a predetermined time required for the writing process.

It is therefore of almost no necessity to implement the operation for monitoring the status, which yields such a advantage that the electric power consumed for that operation can be reduced.

Note that the present invention is not limited to the embodiments discussed above but may be modified in a variety of forms, and there may be, for example, the following modified examples (a)–(e).

(a) The disk card assumes the card-like configuration in the name card size so as to be attachable to the digital camera, etc., but is not confined to the card-like configuration.

(b) The interface unit 10 is not limited to the ATA Standards but may be the one capable of transferring the data in accordance with a given format.

(c) The number of the memory chips 50a–50n, the storage capacity, the transfer speed and the size of the transfer data, are not limited to the numerical values shown in the embodiments.

(d) The number-of-chips managing unit 32 restricts the number of the memory chips 50i operating simultaneously to "3", however, it may be set to an arbitrary number depending on a capacity of the power supply, a data quantity and a necessary write time.

(e) The memory control timer 33 shown in FIG. 3 is constructed so that the count timer 33a counts at first the necessary writing operation time of the memory chip 50i, however, if the time storage register 33b is stored with a rough order of necessary writing operation time, the count timer 33a can be omitted.

As discussed above in greater detail, according to the first invention, there is provided the control module for restricting the simultaneous writing operations to the memory chips by managing the output of the write data to the plurality of memory chips. It is therefore possible to prevent the power supply from making a large current flow momentarily therefrom and to thereby reduce the capacity of the power supply.

According to the second invention, after the necessary write time of the memory chip has elapsed, the completion of the writing operation to that memory chip is monitored. Therefore, the unnecessary operation for monitoring is eliminated, which leads to a decrease in the consumption electric power.

According to the third invention, the disk card is formed in the card-like shape and can be connected via the interface module to the host such as the digital camera, etc. Hence, the disk card is, when in use, suitably attached to the portable host having a small capacity of the power supply.

It is apparent that, in this invention, a wide range of different working modes can be formed based on the invention without deviating from the spirit and scope of the invention. This invention is not restricted by its specific working modes except being limited by the appended claims.

What is claimed is:

1. A nonvolatile semiconductor disk device comprising:
an interface unit which transfers data;
a plurality of memory units each of which has a nonvolatile semiconductor memory storing data transferred from or to said interface unit and a first buffer memory temporarily holding said data to write said data to said nonvolatile semiconductor memory; and
a control unit which transfers said data from an outside device via said interface unit to said memory units when the number of writing processes that are simultaneously being executed in said plurality of memory units is smaller than a predetermined value, wherein said predetermined value is smaller than the number of said memory units, said control unit further including a memory control timer for counting the time needed for writing to each memory unit, and starts monitoring whether or not the writing operations to each memory unit are completed, with a write time counted by said memory control timer serving as a trigger.

2. A nonvolatile semiconductor disk device according to claim 1, wherein said control unit outputs the data to said memory units and thereafter starts monitoring whether or not the writing processes to said memory units are completed after an elapse of a fixed time substantially corresponding to a necessary writing time in said memory units.

3. A nonvolatile semiconductor disk device according to claim 1, wherein said control unit further includes registers registering addresses of said memory units in the process of the writing operation, and controls the outputs to said memory unit so that the number of simultaneous writing operations does not exceed a predetermined value on the basis of the addresses registered in said registers.

4. A method controlling transfer of data from an external source via an interface to a plurality of memory units, each memory unit including a nonvolatile semiconductor memory, the method comprising:
storing a first buffer memory with said data;
monitoring the number of writing processes that are simultaneously being executed in said plurality of nonvolatile semiconductor memory;
transferring said data stored in said first buffer memory to a second buffer memory in said memory units when the number of writing processes that are simultaneously being executed in said plurality of memory units is smaller than a predetermined value, wherein said predetermined value is smaller than the number of said memory units;
counting a write time needed for writing to each memory unit;
starting monitoring whether or not the writing operations to each memory unit are completed, with the write time serving as a trigger; and
transferring said data stored in said second buffer memory to said nonvolatile semiconductor memory.

5. The method of claim 4, further comprising monitoring whether or not the writing processes to said memory units are completed after an elapse of a fixed time substantially corresponding to a necessary writing time in said memory units.

6. A nonvolatile semiconductor disk device comprising:
an interface unit transferring data;
a plurality of memory units each including a nonvolatile semiconductor memory storing data transferred from or to said interface unit, and a buffer memory temporarily holding the data to write the data to said nonvolatile semiconductor memory; and a control unit which having a managing unit which monitors a state of each memory unit and restricting a writing process so as to not simultaneously execute the writing processes to more than a predetermined number of memory units, said control unit further including a memory control timer for counting the time needed for writing to each memory unit, and starts monitoring whether or not the writing operations to each memory unit are completed, with a write time counted by said memory control timer serving as a trigger.

* * * * *